United States Patent
Lee et al.

(10) Patent No.: US 8,413,701 B2
(45) Date of Patent: Apr. 9, 2013

(54) LASER BEAM IRRADIATION APPARATUS AND SUBSTRATE SEALING APPARATUS INCLUDING THE SAME

(75) Inventors: Jung-Min Lee, Yongin (KR); Hee-Seong Jeong, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 14 days.

(21) Appl. No.: 13/083,191

(22) Filed: Apr. 8, 2011

(65) Prior Publication Data

US 2012/0000611 A1 Jan. 5, 2012

(30) Foreign Application Priority Data

Jul. 5, 2010 (KR) .................. 10-2010-0064392

(51) Int. Cl.
- B32B 37/06 (2006.01)
- B32B 37/02 (2006.01)
- B32B 37/14 (2006.01)
- G02B 26/10 (2006.01)

(52) U.S. Cl.
USPC ................................... 156/380.9

(58) Field of Classification Search ............ 156/379.6, 156/380.9; 219/121.73, 121.6, 121.85; 445/25; 359/200.8
See application file for complete search history.

(56) References Cited

U.S. PATENT DOCUMENTS

| | | | |
|---|---|---|---|
| 4,819,486 A * | 4/1989 | Kunkel et al. ............. | 73/382 R |
| 5,400,428 A | 3/1995 | Grace | |
| 5,404,001 A | 4/1995 | Bard et al. | |
| 5,422,469 A | 6/1995 | Bard et al. | |
| 6,688,526 B2 | 2/2004 | Metlitsky et al. | |
| 6,962,289 B2 | 11/2005 | Vatan et al. | |
| 7,673,803 B2 | 3/2010 | Tsikos et al. | |
| 2004/0154737 A1* | 8/2004 | Chen et al. ................ | 156/272.8 |
| 2005/0100703 A1* | 5/2005 | Terada et al. ................ | 428/57 |
| 2007/0128967 A1 | 6/2007 | Becken et al. | |
| 2008/0110561 A1* | 5/2008 | Lee et al. ................. | 156/275.3 |
| 2009/0086325 A1 | 4/2009 | Liu et al. | |
| 2010/0109516 A1 | 5/2010 | Warashina et al. | |

FOREIGN PATENT DOCUMENTS

| | | |
|---|---|---|
| EP | 2101366 A1 * | 9/2009 |
| JP | 06-038975 | 2/1994 |
| JP | 08-211313 | 8/1996 |
| KR | 1994-0009876 A | 5/1994 |
| KR | 10-0346550 A | 7/2002 |
| KR | 10-2006-0017495 A | 2/2006 |
| KR | 10-2007-0088715 A | 8/2007 |
| KR | 10-2009-0039247 A | 4/2009 |
| KR | 10-2009-0128431 A | 12/2009 |

OTHER PUBLICATIONS

Korean Office action issued by the Korean Industrial Property Office on Jul. 26, 2011 in the corresponding Korean Patent Application No. 10-2010-0064392.

* cited by examiner

*Primary Examiner* — Daniel McNally
(74) *Attorney, Agent, or Firm* — Robert E. Bushnell, Esq.

(57) ABSTRACT

A laser beam irradiation apparatus comprises: a laser oscillator; an optical fiber for transmitting a laser beam oscillated by the laser oscillator; an optical tube for accommodating an end of the optical fiber, and for performing a rectilinear motion on a plane perpendicular to a direction in which the laser beam is irradiated; and a pair of piezoelectric transducers disposed between the optical tube and the end of the optical fiber, and having first ends supporting the optical fiber. Each piezoelectric transducer performs a rectilinear reciprocating motion in a direction perpendicular to the other piezoelectric transducer on a plane perpendicular to the direction in which the laser beam is irradiated.

19 Claims, 7 Drawing Sheets

# LASER BEAM IRRADIATION APPARATUS AND SUBSTRATE SEALING APPARATUS INCLUDING THE SAME

CLAIM OF PRIORITY

This application makes reference to, incorporates the same herein, and claims all benefits accruing under 35 U.S.C. §119 from an application earlier filed in the Korean Intellectual Property Office on Jul. 5, 2010 and there duly assigned Serial No. 10-2010-0064392.

BACKGROUND OF THE INVENTION

1. Field of the Invention

The present invention relates to a laser beam irradiation apparatus and a substrate sealing apparatus including the laser beam irradiation apparatus.

2. Description of the Related Art

A method of sealing an upper substrate and a lower substrate together using a sealant is used as a method of sealing a display device. For example, in a display device including an organic light emitting unit between an upper substrate and a lower substrate, after coating frit around the organic light emitting unit, a laser beam is irradiated onto the frit by using a laser beam irradiation apparatus, and the laser beam is moved along a sealing line of the frit by moving the laser beam irradiation apparatus. The upper substrate and the lower substrate are sealed together by hardening the frit through irradiation of the laser beam.

In this regard, when the sealing line of the frit includes a curved path having a predetermined curvature, a rotational angle of the curved path of the frit and a rotational angle of an optical tube of the laser beam irradiation apparatus must correspond to each other. If the rotational angle of the optical tube and the rotational angle of the curved path of the frit do not match, defective sealing may occur.

SUMMARY OF THE INVENTION

Embodiments of the present invention are directed toward a laser beam irradiation apparatus capable of increasing sealing quality without rotation of an optical tube and a substrate sealing apparatus including the laser beam irradiation apparatus.

According to an embodiment of the present invention, a laser beam irradiation apparatus includes: a laser oscillator; an optical fiber for transmitting a laser beam oscillated by the laser oscillator; an optical tube for accommodating an end of the optical fiber, and for performing a rectilinear motion on a plane perpendicular to a direction in which the laser beam is irradiated; and a pair of piezoelectric transducers disposed between the optical tube and the end of the optical fiber, and having first ends supporting the optical fiber; wherein each of the pair of piezoelectric transducers performs a rectilinear reciprocating motion in a direction perpendicular to the other of the pair of piezoelectric transducer on a plane perpendicular to the direction in which the laser beam is irradiated.

The laser beam irradiation apparatus may include a pair of zero point adjustment units disposed so as to face the pair of piezoelectric transducers with respect to the optical fiber for adjusting zero points of the optical fiber.

The pair of zero point adjustment units may include springs.

The optical fiber may be disposed in the center of the pair of piezoelectric transducers and the pair of zero point adjustment units.

When one of the pair of piezoelectric transducers moves, the optical fiber may move in a zigzag motion in a direction perpendicular to a moving direction of the optical tube.

When the pair of piezoelectric transducers simultaneously moves, the optical fiber may move in a zigzag motion in a direction perpendicular to a curved path and along the curved path.

A gap having a width two times greater than the amplitude of the optical fiber may be formed in an entrance of the optical tube in which the end of the optical fiber is accommodated.

The laser beam irradiation apparatus may include a control unit for controlling amplitudes, the number of vibrations, or vibration directions of the pair of piezoelectric transducers.

The laser beam irradiation apparatus may include a beam homogenizer disposed between the laser oscillator and the optical tube for making the beam intensity uniform in a cross-section of the laser beam.

The optical tube may include a lens unit for collecting the laser beam irradiated from the optical fiber.

According to another embodiment of the present invention, a laser beam irradiation apparatus includes a display device comprising a first substrate, a second substrate, and a sealing unit disposed between the first substrate and the second substrate, in combination with the elements of the laser beam irradiation apparatus as described above for irradiating a laser beam onto the sealing unit.

The laser beam irradiation apparatus may include a pair of zero point adjustment units disposed to face a pair of piezoelectric transducers with respect to an optical fiber for focusing zero points of the optical fiber on the center of the sealing unit.

The substrate sealing apparatus may include a mask disposed between the display device and the laser beam irradiation apparatus, and an opening formed in an area corresponding to the sealing unit.

The laser beam irradiation apparatus may include a gap formed in an entrance of an optical tube in which the end of the optical fiber is accommodated, the gap being greater than the width of the sealing unit.

The laser beam may dither left and right on a sealing path of the sealing unit and move thereon.

The sealing path may be formed on a closed loop, and the laser beam irradiation apparatus may irradiate the laser beam along the sealing path on the closed loop without rotating the optical tube.

The sealing path may include a rectilinear path and a curved path.

The sealing unit may include frit.

The display device may include an organic light emitting unit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
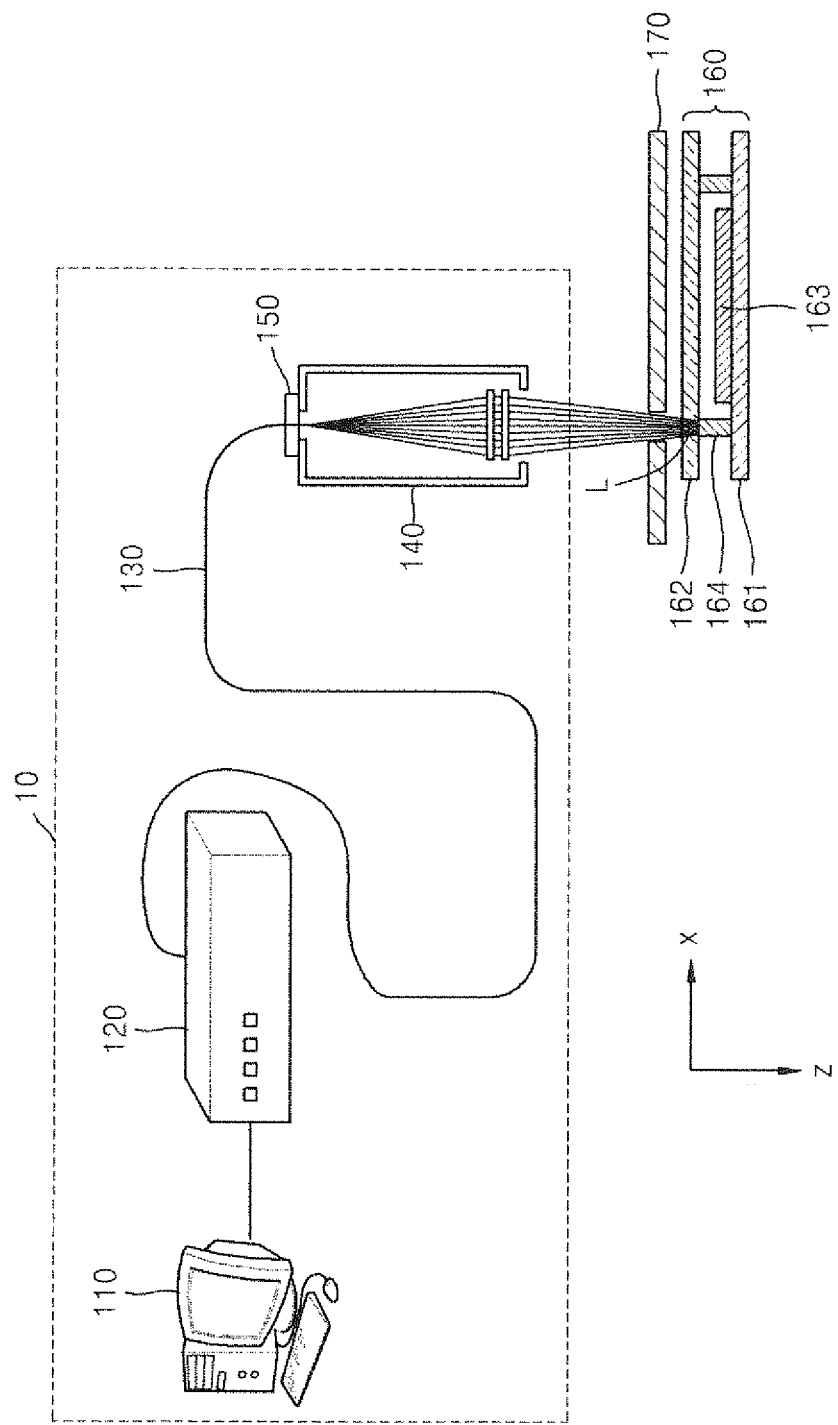
FIG. 1 is a schematic diagram of a substrate sealing apparatus for sealing a sealing unit of a display device by using a laser beam irradiation apparatus according to an embodiment of the present invention.
Figure 2:
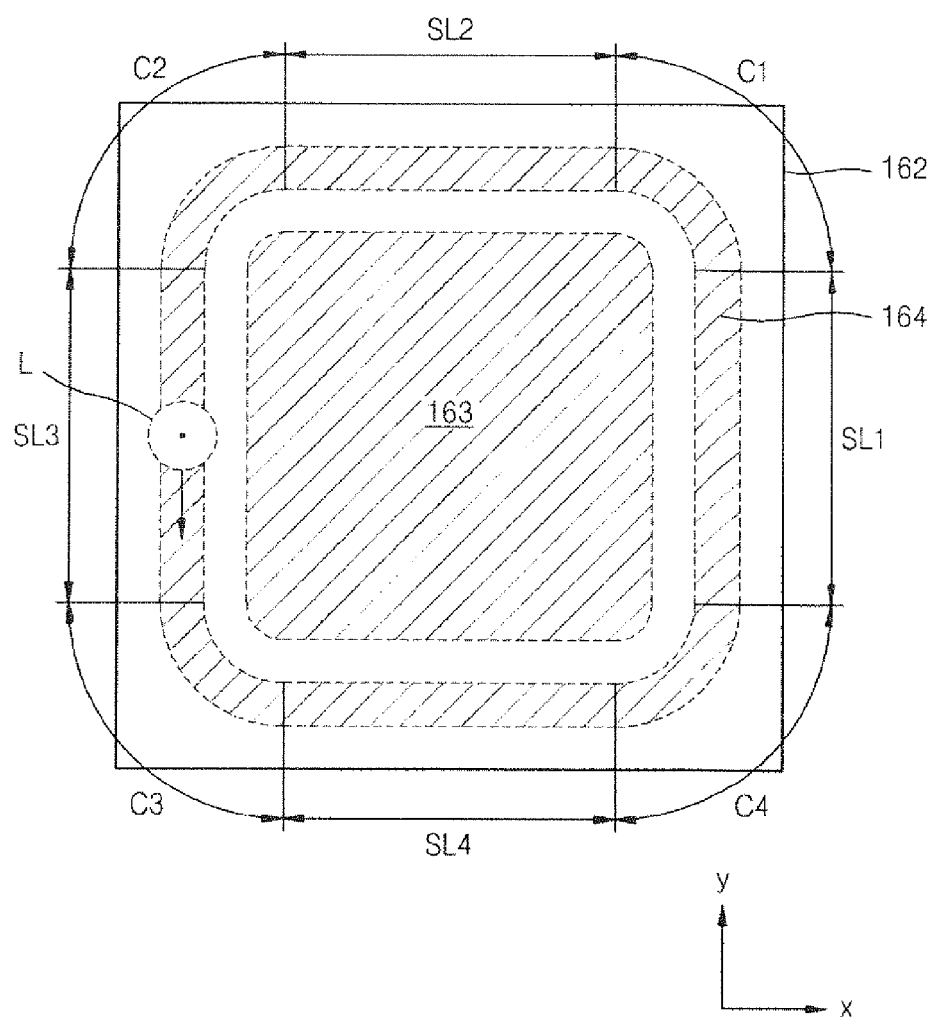
FIG. 2 is a schematic top view of the display device of FIG. 1.

FIG. 1 is a schematic diagram of a substrate sealing apparatus for sealing a sealing unit of a display device by using a laser beam irradiation apparatus according to an embodiment of the present invention, and FIG. 2 is a schematic top view of the display device of FIG. 1.

Referring to FIG. 1, an organic light emitting unit 163 and the sealing unit 164, which surrounds the organic light emitting unit 163, are disposed between a first substrate 161 and a second substrate 162, and a laser beam L is irradiated from an optical tube 140 onto the scaling unit 164.

The organic light emitting unit 163 is formed on the first substrate 161.

The second substrate 162 is an encapsulation substrate which encapsulates the organic light emitting unit 163 formed on the first substrate 161, and may be a glass substrate through which the laser beam L may be transmitted.

The organic light emitting unit 163 includes an emission layer interposed between a first electrode (not shown) and a second electrode (not shown). The first electrode (not shown) and the second electrode (not shown) may function as an anode for injecting holes and a cathode for injecting electrons, respectively.

The organic light emitting unit 163 may be a passive matrix (PM) OLED or an active matrix (AM) OLED according to a driving method thereof. Furthermore, the present embodiment may be applied to a display device including additional display units and the organic light emitting unit 163.

The sealing unit 164 is disposed between the first substrate 161 and the second substrate 162 so as to surround the organic light emitting unit 163.

In the present embodiment, the sealing unit 164 is formed of fit so as to provide a tight bond between the first substrate 161 and the second substrate 162 and to effectively protect the organic light emitting unit 163. The frit is formed so as to have a predetermined frit width (FW) by using any of various methods, such as a screen printing method or a pen dispensing method.

Furthermore, the sealing unit 164 may be a closed loop in order to prevent contact between the organic light emitting unit 163 and water or oxygen from outside the sealing unit 164.

Referring to FIG. 2, edges of the sealing unit 164 forming a closed loop may be four curved paths C1, C2, C3, and C4, each having a predetermined curvature, and four straight paths SL1, SL2, SL3, and SL4 disposed between the four curved paths C1, C2, C3, and C4, respectively, but the present invention is not limited thereto. The edges of the sealing unit 164 may be right-angled without any curvature.

Meanwhile, although not shown, a stage that supports the display device 160 and is rotatable may be formed under the display device 160.

The laser beam irradiation apparatus 10 irradiates the laser beam L, which may dither left and right, and move quickly along a sealing path of the sealing unit 164 disposed between the first substrate 161 and the second substrate 162. This will be described in more detail below.

The laser beam irradiation apparatus 10 includes a controllable PC 110, a laser oscillator 120, an optical fiber 130, and the optical tube 140 including two light collection lenses 141 (seen in FIG. 3 discussed below).

The controllable PC 110 controls the general operation of the laser beam irradiation apparatus 10, such as irradiation intensity of the laser beam L, irradiation duration thereof, irradiation position thereof, and the like. The controllable PC 110 may control amplitudes, the number, and directions of vibrations of a pair of piezoelectric transducers 152 and 153 (seen in FIG. 4 which will be described later).

The laser oscillator 120 oscillates the laser beam L.

The laser oscillator 120 may further include an attenuator (not shown). The attenuator adjusts the output of the laser beam L and transmits the laser beam L to the optical fiber 130. The output of the laser beam L during a sealing process which uses the laser beam L varies according to processing time, and thus it is necessary to adjust the output of the laser beam L according to the processing time so as to optimize the processing condition. However, when the output of the laser beam L is adjusted by adjusting a current inside the laser oscillator 120, the attenuator may be used to adjust the output of the laser beam L.

The laser oscillator 120 may be a bundle-type multi-core source, that is, a high output laser source which is typically used for laser sealing.

When the laser oscillator 120 is a bundle-type multi-core source, output of each of cores may vary. The non-uniform outputs may be made uniform by using a beam homogenizer (not shown) for making the beam intensity uniform across a cross-section of the laser beam L. The beam homogenizer (not shown) may be a multimode optical fiber, a fly-eye lens, or the like.

The optical fiber 130 transmits the laser beam L oscillated by the laser oscillator 120 and irradiates the laser beam L at an end thereof. The laser beam L may have a uniform intensity across a cross-section thereof after passing through the beam homogenizer (not shown).

Figure 3:
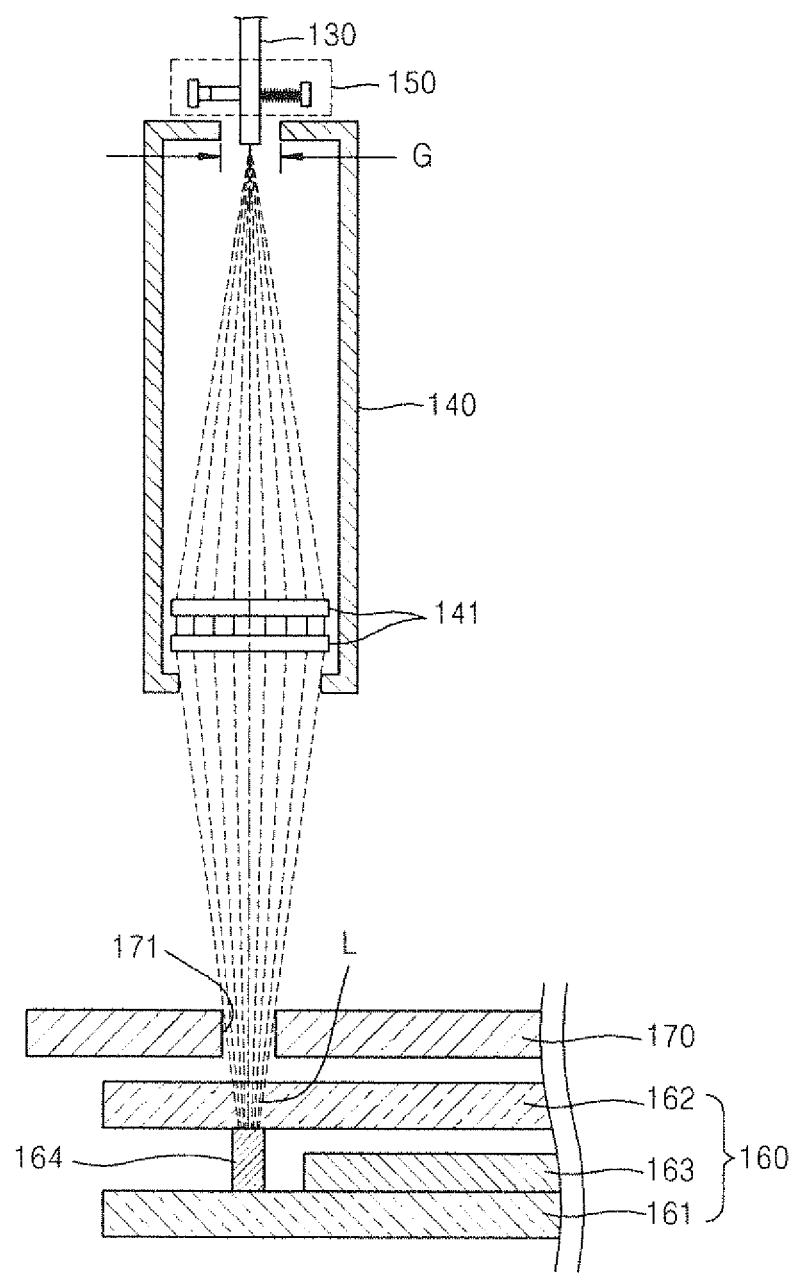
FIG. 3 is a cross-sectional view of an optical tube according to an embodiment of the present invention.

FIG. 3 is a cross-sectional view of the optical tube according to an embodiment of the present invention.

Referring to FIG. 3, the end of the optical fiber 130 is connected to the optical tube 140, including the light collection lenses 141.

Each of the light collection lenses 141 includes at least one properly designed lens, and is used to form an undistorted image using the laser beam L irradiated onto predetermined areas of the first substrate 161 and the second substrate 162 of the display device 160. The light collection lenses 141 of the present embodiment include two lenses to achieve 1:1 focusing, but the present invention is not limited thereto.

The laser beam L forms an image on the sealing unit 164 of the display device 160 after passing through the optical tube 140.

In this regard, in order to prevent the display device 160 from deteriorating due to the laser beam L, a mask 170 having an opening 171 formed therein is disposed in an area corresponding to the sealing unit 164 between the display device 160 and the optical tube 140, thereby adjusting the width of the laser beam L irradiated onto the sealing unit 164.

A gap G is formed in accordance with a predetermined interval at an entrance of the optical tube 140 in which the end of the optical fiber 130 is accommodated. The end of the optical fiber 130 moves inside the gap G by adjusting an optical fiber movement adjustment unit 150, which will be described later. Thus, when the optical fiber 130 performs a rectilinear movement having a predetermined amplitude A, the size of the gap G must be at least two times the amplitude A, i.e., greater than a vibration width 2A.

Meanwhile, the optical tube 140 of the present embodiment does not include any additional units for rotating the optical tube 140 by a predetermined rotational angle, and performs a rectilinear motion in an X direction or a Y direction on a plane XY perpendicular to an irradiation direction Z of the laser beam L.

The optical fiber movement adjustment unit 150 for adjusting the movement of the optical fiber 130 is disposed between the end of the optical fiber 130 and the optical tube 140.

Figure 4:
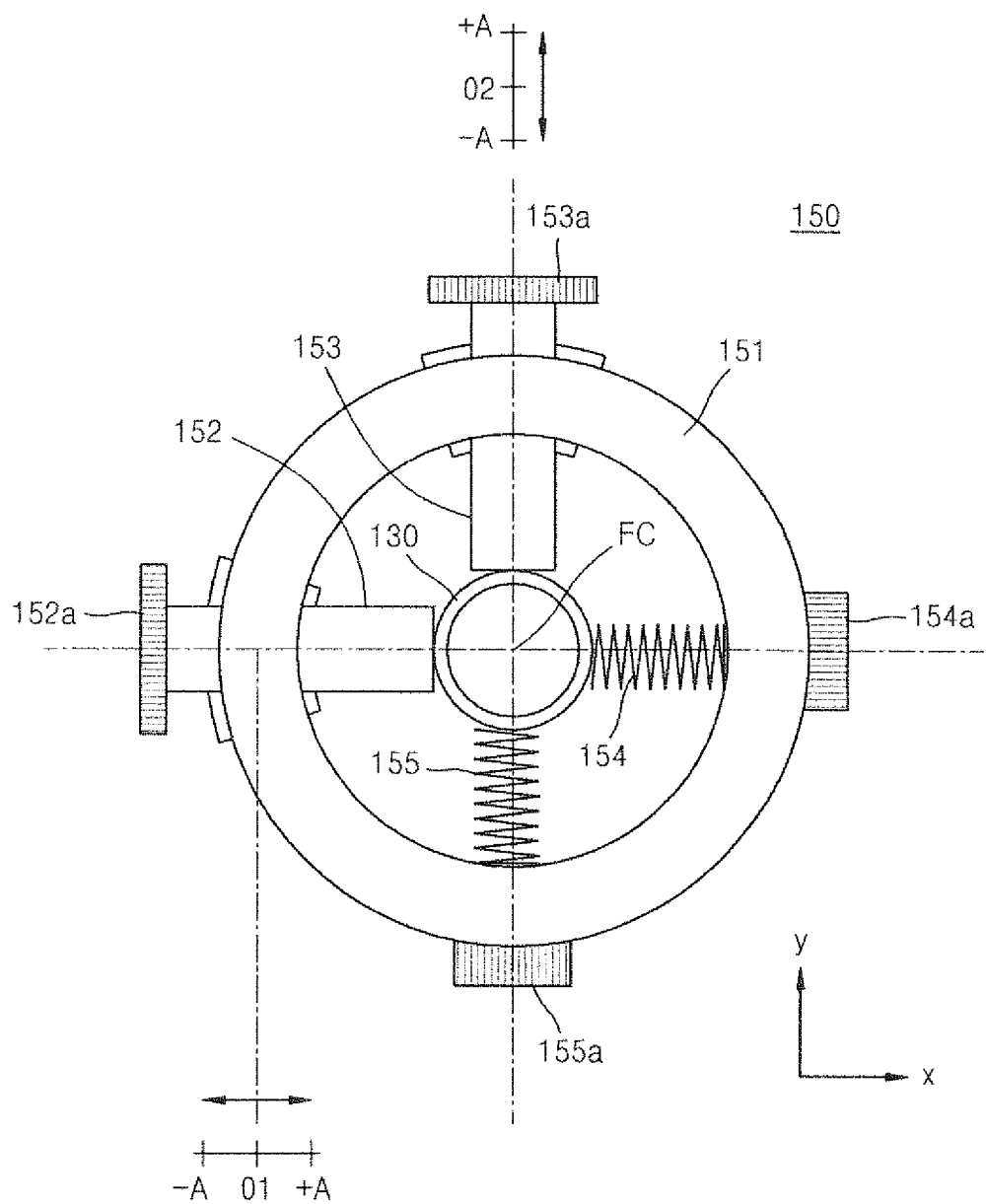
FIG. 4 is a detailed top view of an optical fiber movement adjustment unit according to an embodiment of the present invention.

FIG. 4 is a detailed top view of the optical fiber movement adjustment unit according to an embodiment of the present invention.

Referring to FIG. 4, the optical fiber movement adjustment unit 150 includes a pair of piezoelectric transducers 152 and 153 and a pair of zero point adjustment units 154 and 155.

The pair of piezoelectric transducers 152 and 153 and the pair of zero point adjustment units 154 and 155 are supported by a fixing frame 151 having a ring shape. The shape of the fixing frame 151 is merely exemplary, and the present invention is not limited thereto.

The piezoelectric transducers 152 and 153 are disposed so as to be perpendicular to each other on the plane XY perpendicular to the irradiation direction Z of the laser beam L, and each performs a rectilinear reciprocating motion in a direction perpendicular to the other.

For example, the first piezoelectric transducer 152 performs a rectilinear reciprocating motion having the amplitude A in an X direction around a first reference 01 of the first piezoelectric transducer 152, and the second piezoelectric transducer 153 performs a rectilinear reciprocating motion having the amplitude A in a Y direction around a second reference 02 of the second piezoelectric transducer 153.

If only the first piezoelectric transducer 152 moves, the optical fiber 130 performs the rectilinear reciprocating motion having the amplitude A in the X direction. If only the second piezoelectric transducer 153 moves, the optical fiber 130 performs the rectilinear reciprocating motion having the amplitude A in the Y direction. If the piezoelectric transducers 152 and 153 simultaneously move, the optical fiber 130 performs a rectilinear reciprocating motion having a predetermined amplitude (e.g., the amplitude A) at a predetermined angle (e.g., 45 degrees). When the optical tube 140 moves along a rectilinear path, the optical fiber 130 generally has a curved path, and moves left and right on the curved path in a zigzag motion. This will be described later.

Piezoelectric transducer reference adjustment units 152a and 153a for adjusting reference points of the piezoelectric transducers 152 and 153, respectively, are included in first ends of the piezoelectric transducers 152 and 153, respectively, and the optical fiber 130 is supported by second ends of the piezoelectric transducers 152 and 153, respectively, so that the optical fiber 130 moves in synchronization with the motions of the piezoelectric transducers 152 and 153, respectively.

The zero point adjustment units 154 and 155 for adjusting a zero point location of the optical fiber 130 are disposed in locations corresponding to the piezoelectric transducers 152 and 153, respectively. The zero point adjustment units 154 and 155 may use springs.

Tension adjustment units 154a and 155a for adjusting tension of the springs of the zero point adjustment units 154 and 155, respectively, and for adjusting fine lengths of the springs are included in first ends of the zero point adjustment units 154 and 155, respectively, and the optical fiber 130 is supported by second ends of the zero point adjustment units 154 and 155 so that a center FC of the optical fiber 130 matches the center of the sealing path of the sealing unit 164 of the display unit 160. The center of the laser beam L may match the center of the sealing path of the sealing unit 164 according to the adjustment of the zero point by the zero point adjustment units 154 and 155.

Figure 5A:
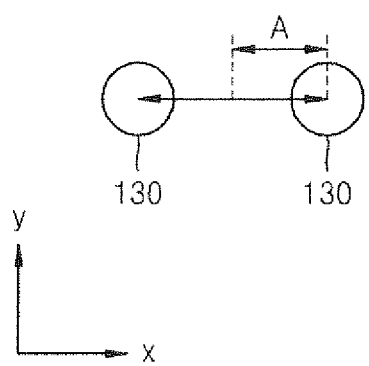
FIGS. 5A and 5B are schematic cross-sectional views illustrating movement of an optical fiber and corresponding movement of a laser beam through a first rectilinear path of a sealing unit according to an embodiment of the present invention.
Figure 5B:
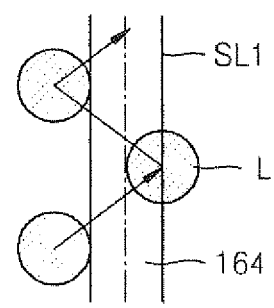

FIGS. 5A and 5B are schematic cross-sectional views illustrating movement of the optical fiber and corresponding movement of the laser beam L through the first rectilinear path SL1 of the sealing unit according to an embodiment of the present invention.

Referring to FIG. 5A, only the first piezoelectric transducer 152 moves, and thus the optical fiber 130 performs a rectilinear reciprocating motion having the amplitude A in the X direction.

Referring to FIG. 5B, the optical tube 140, which accommodates the end of the optical fiber 130, moves along the first rectilinear path SL1 of the sealing unit 164, and thus the optical fiber 130 moves in a zigzag motion in a direction perpendicular to the first rectilinear path SL1 of the sealing unit 164. Thus, the laser beam L irradiated from the optical fiber 130 also moves in the zigzag motion in a direction perpendicular to the first rectilinear path SL1 of the sealing unit 164.

Figure 6A:
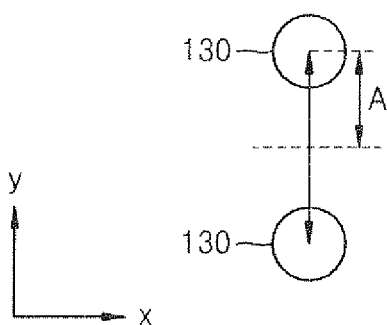
FIGS. 6A and 6B are schematic cross-sectional views illustrating movement of an optical fiber and corresponding movement of a laser beam through a second rectilinear path of a sealing unit according to an embodiment of the present invention.
Figure 6B:
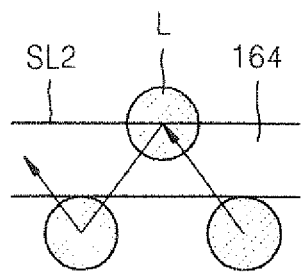

FIGS. 6A and 6B are schematic cross-sectional views illustrating movement of the optical fiber and corresponding movement of the laser beam L through the second rectilinear path SL2 of the sealing unit according to an embodiment of the present invention.

Referring to FIG. 6A, only the second piezoelectric transducer 153 moves, and thus the optical fiber 130 performs a rectilinear reciprocating motion having the amplitude A in the Y direction.

Referring to FIG. 6B, the optical tube 140, which accommodates the end of the optical fiber 130, moves along the second rectilinear path SL2 of the sealing unit 164, and thus the optical fiber 130 moves in a zigzag motion in a direction perpendicular to the second rectilinear path SL 2 of the sealing unit 164. Thus, the laser beam L irradiated from the optical fiber 130 also moves in a zigzag motion in a direction perpendicular to the second rectilinear path SL2 of the sealing unit 164.

Although the first rectilinear, path SL1 and the second rectilinear path SL2 of the sealing unit 164 are shown in FIGS. 5B and 6B, descriptions thereof may also be applied to a third rectilinear path SL3 and a fourth rectilinear path SL4 of the sealing unit 164.

Figure 7A:
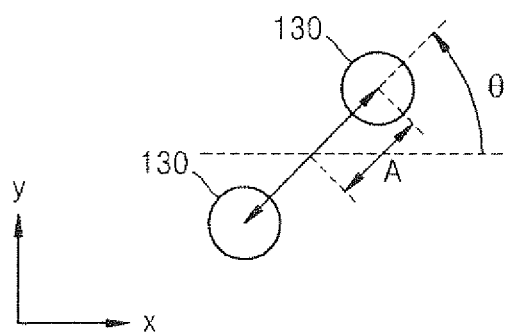
FIGS. 7A and 7B are schematic cross-sectional views illustrating movement of an optical fiber and corresponding movement of a laser beam through a first curved path of a sealing unit.
Figure 7B:
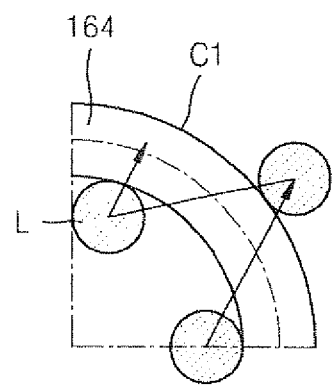
Figure 7C:
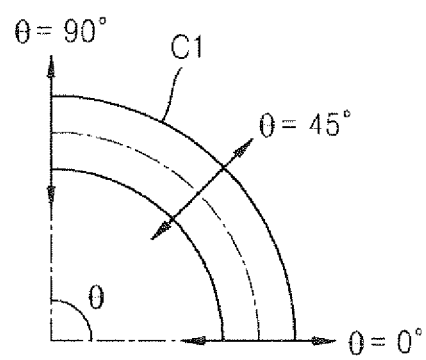
FIG. 7C shows a vibration angle of the optical fiber allowable for the first curved path, according to an embodiment of the present invention.

FIGS. 7A and 7B are schematic cross-sectional views illustrating movement of the optical fiber and corresponding movement of the laser beam L through the first curved path C1 of the sealing unit, and FIG. 7C shows a vibration angle θ of the optical fiber allowable for the first curved path C 1, according to an embodiment of the present invention.

Referring to FIG. 7A, the piezoelectric transducers 152 and 153 simultaneously move, and thus the optical fiber 130 performs a rectilinear reciprocating motion at the vibration angle θ and at the amplitude A.

Referring to FIG. 7B, although the optical tube 140, which accommodates the end of the optical fiber 130, moves along a rectilinear path, the optical fiber 130 generally has a curved path, and moves left and right on the curved path in a zigzag motion. Thus, the laser beam L irradiated from the optical fiber 130 also moves in a zigzag motion in a direction perpendicular to the first curved path C1 of the sealing unit 164.

Referring to FIG. 7C, the vibration angle θ of the optical fiber 130, allowable for the first curved path C1 of the sealing unit 164, is greater than 0 degree and smaller than 90 degrees. The vibration angle θ is simply a sum of vibration vectors of the piezoelectric transducers 152 and 153, and thus may be adjusted. That is, the sum of vibration vectors may be obtained from a combination of vibrations, the number of vibrations, and the vibration angle of the optical fiber 130 with respect to the piezoelectric transducers 152 and 153, and may be controlled by a control unit (not shown).

Figure 8A:
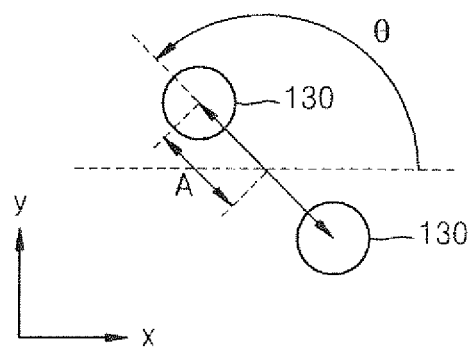
FIGS. 8A and 8B are schematic cross-sectional views illustrating movement of an optical fiber and corresponding movement of a laser beam through a second curved path of a sealing unit.
Figure 8B:
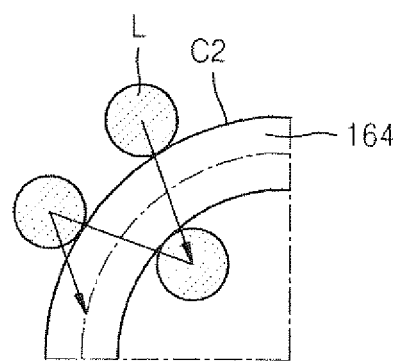
Figure 8C:
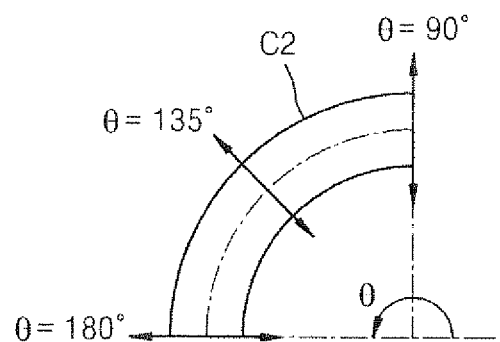
FIG. 8C shows a vibration angle of the optical fiber allowable for the second curved path, according to an embodiment of the present invention.

FIGS. 8A and 8B are schematic cross-sectional views illustrating movement of the optical fiber and corresponding movement of the laser beam L through the second curved path C2 of the sealing unit, and FIG. 8C shows a vibration angle θ of the optical fiber allowable for the second curved path C1 according to an embodiment of the present invention.

Referring to FIG. 8A, the piezoelectric transducers 152 and 153 simultaneously move, and thus the optical fiber 130 performs a rectilinear reciprocating motion having the vibration angle θ and the amplitude A.

Referring to FIG. 8B, although the optical tube 140, accommodating the end of the optical fiber 130, moves along a rectilinear path, the optical fiber 130 generally has a curved path, and moves left and right in a zigzag motion on the curved path. Thus, the laser beam L irradiated from the optical fiber 130 also moves in a zigzag motion in a direction perpendicular to the second curved path C2 of the sealing unit 164.

Referring to FIG. 8C, the vibration angle θ of the optical fiber 130, allowable for the second curved path C2 of the sealing unit 164, is greater than 90 degree and smaller than 180 degrees. The vibration angle θ is simply a sum of vibration vectors of the piezoelectric transducers 152 and 153, and thus may be adjusted. That is, the sum of vibration vectors may be obtained from a combination of vibrations, the number of vibrations, and the vibration angle of the optical fiber 130 with respect to the piezoelectric transducers 152 and 153.

Although the first curved path C1 and the second curved path C2 of the sealing unit 164 are shown in FIGS. 7A thru 8C, descriptions thereof may also be applied to a third curved path C3 and a fourth curved path C4 of the sealing unit 164. For example, a vibration angle θ of the optical fiber 130, allowable for the third curved path C3, is greater than 180 degrees and smaller than 270 degrees, and a vibration angle θ of the optical fiber 130, allowable for the fourth curved path C4, is greater than 270 degrees and smaller than 360 degrees.

As described above, the laser beam L irradiated from the optical fiber 130 according to the operations of the piezoelectric transducers 152 and 153 dithers left and right and moves along paths of the closed loop of the sealing unit 164 including the curved paths. Thus, although the optical tube 140 does not mechanically rotate, the optical tube 140 is able to rotate by 360 degrees by scanning all paths on the closed loop once. Thus, no rotation unit is needed, thereby simplifying the structure of the laser beam irradiation apparatus, and the optical tube 140 and the sealing path of the sealing unit 164 are in alignment with each other, thereby preventing defective sealing.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A laser beam irradiation apparatus, comprising:
   a laser oscillator;
   an optical fiber for transmitting a laser beam oscillated by the laser oscillator;
   an optical tube for accommodating an end of the optical fiber, and for performing a rectilinear motion in a plane perpendicular to a direction in which the laser beam is transmitted; and
   a pair of piezoelectric transducers disposed between the optical tube and the end of the optical fiber, and having first ends supporting the optical fiber, wherein each piezoelectric transducer performs a rectilinear reciprocating motion in a direction perpendicular to another piezoelectric transducer in the plane perpendicular to the direction in which the laser beam is transmitted.

2. The laser beam irradiation apparatus of claim 1, further comprising a pair of zero point adjustment units disposed so as to face the pair of piezoelectric transducers with respect to the optical fiber for adjusting zero points of the optical fiber.

3. The laser beam irradiation apparatus of claim 2, wherein the zero point adjustment units comprise springs.

4. The laser beam irradiation apparatus of claim 2, wherein the optical fiber is disposed in a center of the pair of piezoelectric transducers and the pair of zero point adjustment units.

5. The laser beam irradiation apparatus of claim 1, wherein, when one of the piezoelectric transducers moves, the optical fiber moves in a zigzag motion in a direction perpendicular to a moving direction of the optical tube.

6. The laser beam irradiation apparatus of claim 1, wherein, when the piezoelectric transducers simultaneously move, the optical fiber moves in a zigzag motion in a direction perpendicular to a curved path and moves along the curved path.

7. The laser beam irradiation apparatus of claim 1, wherein a gap having a width two times greater than an amplitude of the optical fiber is formed at an entrance of the optical tube in which the end of the optical fiber is accommodated.

8. The laser beam irradiation apparatus of claim 1, further comprising a control unit for controlling at least one of amplitudes, a number of vibrations, and vibration directions of the pair of piezoelectric transducers.

9. The laser beam irradiation apparatus of claim 1, further comprising a beam homogenizer disposed between the laser oscillator and the optical tube for making the beam intensity uniform in a cross-section of the laser beam.

10. The laser beam irradiation apparatus of claim 1, wherein the optical tube comprises a lens unit for collecting the laser beam transmitted from the optical fiber.

11. A substrate sealing apparatus, comprising the laser beam irradiating device of claim 1, and further comprising:
   a display device comprising a first substrate, a second substrate, and a sealing unit disposed between the first substrate and the second substrate;
   wherein the laser beam irradiation apparatus irradiates a laser beam onto the sealing unit.

12. The substrate sealing apparatus of claim 11, wherein the laser beam irradiation apparatus comprises a gap formed in an entrance of the optical tube in which the end of the optical fiber is accommodated, said gap being greater than a width of the sealing unit.

13. The substrate sealing apparatus of claim 12, wherein the laser beam dithers left and right on a sealing path of the sealing unit and moves along the sealing path.

14. The substrate sealing apparatus of claim 13, wherein the sealing path is formed in a closed loop, and the laser beam irradiation apparatus irradiates the laser beam along the sealing path in the closed loop without rotating the optical tube.

15. The substrate sealing apparatus of claim 14, wherein the sealing path includes a rectilinear path and a curved path.

16. The substrate sealing apparatus of claim 11, wherein the laser beam irradiation apparatus comprises a pair of zero point adjustment units disposed so as to face the pair of piezoelectric transducers with respect to the optical fiber for focusing zero points of the optical fiber in a center of the sealing unit.

17. The substrate sealing apparatus of claim 11, further comprising a mask disposed between the display device and the laser beam irradiation apparatus, and comprising an opening formed in an area corresponding to the sealing unit.

18. The substrate sealing apparatus of claim 11, wherein the sealing unit comprises frit.

19. The substrate sealing apparatus of claim 11, wherein the display device comprises an organic light emitting unit.

* * * * *